United States Patent
Zijp

(10) Patent No.: US 11,694,821 B2
(45) Date of Patent: Jul. 4, 2023

(54) REFLECTOR AND METHOD OF MANUFACTURING A REFLECTOR

(71) Applicant: ASML Netherlands B.V., Veldhoven (NL)

(72) Inventor: Ferry Zijp, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 67 days.

(21) Appl. No.: 17/409,213

(22) Filed: Aug. 23, 2021

(65) Prior Publication Data

US 2021/0383940 A1 Dec. 9, 2021

Related U.S. Application Data

(62) Division of application No. 16/440,099, filed on Jun. 13, 2019, now Pat. No. 11,145,428.

(30) Foreign Application Priority Data

Jun. 15, 2018 (EP) ...................................... 18178127

(51) Int. Cl.
  *G03F 7/20* (2006.01)
  *G21K 1/06* (2006.01)
  *B24C 1/08* (2006.01)

(52) U.S. Cl.
  CPC .................. *G21K 1/06* (2013.01); *B24C 1/08* (2013.01); *G21K 1/067* (2013.01); *G21K 2201/064* (2013.01); *G21K 2201/067* (2013.01)

(58) Field of Classification Search
  CPC .......... G21K 1/06; G21K 1/067; G21K 1/062; G21K 2201/064; G21K 2201/067;
  (Continued)

(56) References Cited

U.S. PATENT DOCUMENTS 3,872,349 A    3/1975  Spero et al.
5,001,737 A *  3/1991  Lewis ...................... G21K 1/02
                                                378/147
(Continued)

FOREIGN PATENT DOCUMENTS

EP    1 152 555 A1    11/2001
EP     1628164 A2     2/2006
(Continued)

OTHER PUBLICATIONS

Semi MF1811 "Guide for Estimating the Power Spectral Density Function and Related Finish parameters from Surface Profile Data", 2008; 21 pages. A.T.H. Beaucamp and Y. Namba, "Technological Advances in Super Fine Polishing", Proc of the 14th EU Soc Pree Eng and Nano Tech (2014).

(Continued)

*Primary Examiner* — Jason L McCormack
(74) *Attorney, Agent, or Firm* — Sterne, Kessler, Goldstein & Fox P.L.L.C.

(57) ABSTRACT

A reflector comprising a hollow body having an interior surface defining a passage through the hollow body, the interior surface having at least one optical surface part configured to reflect radiation and a supporter surface part, wherein the optical surface part has a predetermined optical power and the supporter surface part does not have the predetermined optical power. The reflector is made by providing an axially symmetric mandrel;
  shaping a part of the circumferential surface of the mandrel to form at least one inverse optical surface part that is not rotationally symmetric about the axis of the mandrel;
  forming a reflector body around the mandrel; and
  releasing the reflector body from the mandrel whereby the reflector body has an optical surface defined by the (Continued)

inverse optical surface part and a supporter surface part defined by the rest of the outer surface of the mandrel.

20 Claims, 10 Drawing Sheets

(58) Field of Classification Search
CPC ... B24C 1/08; G03F 7/70166; G03F 7/70625; G03F 7/70958; G01N 21/9501; G01N 21/956
USPC .......................................... 250/505.1; 264/1.9
See application file for complete search history.

(56) References Cited

U.S. PATENT DOCUMENTS

| | | | |
|---|---|---|---|
| 5,741,445 A * | 4/1998 | Taylor | H01Q 15/141 264/2.6 |
| 5,744,813 A | 4/1998 | Kumakhov | |
| 6,118,130 A | 9/2000 | Barry | |
| 6,278,764 B1 | 8/2001 | Barbee, Jr. et al. | |
| 6,847,700 B1 | 1/2005 | Mitra et al. | |
| 6,952,253 B2 | 10/2005 | Lof et al. | |
| 7,321,127 B2 | 1/2008 | Bavdaz et al. | |
| 7,701,577 B2 | 4/2010 | Straaijer et al. | |
| 7,791,724 B2 | 9/2010 | Den Boef et al. | |
| 8,115,926 B2 | 2/2012 | Straaijer | |
| 8,553,227 B2 | 10/2013 | Jordanoska | |
| 8,681,312 B2 | 3/2014 | Straaijer | |
| 8,692,994 B2 | 4/2014 | Straaijer | |
| 8,735,844 B1 | 5/2014 | Khaykovich et al. | |
| 8,792,096 B2 | 7/2014 | Straaijer | |
| 8,797,554 B2 | 8/2014 | Straaijer | |
| 8,810,775 B2 | 8/2014 | Kools | |
| 8,823,922 B2 | 9/2014 | Straaijer | |
| 11,145,428 B2 | 10/2021 | Zijp | |
| 2003/0095622 A1 | 5/2003 | Schultz et al. | |
| 2006/0071354 A1 | 4/2006 | Hill et al. | |
| 2006/0268246 A1 | 11/2006 | Lacobs et al. | |
| 2007/0247639 A1 | 10/2007 | Amstel et al. | |
| 2008/0099699 A1 | 5/2008 | Yabuta et al. | |
| 2008/0099935 A1 | 5/2008 | Egle et al. | |
| 2009/0225400 A1 | 9/2009 | Ansems et al. | |
| 2009/0272917 A1 | 11/2009 | Soer et al. | |
| 2010/0091941 A1 | 4/2010 | Zocchi et al. | |
| 2010/0328655 A1 | 12/2010 | Den Boef | |
| 2011/0026032 A1 | 2/2011 | Van De Kerkhof et al. | |
| 2011/0102753 A1 | 5/2011 | Van De Kerkhof et al. | |
| 2011/0249244 A1 | 10/2011 | Leewis et al. | |
| 2012/0044470 A1 | 2/2012 | Smilde et al. | |
| 2013/0092849 A1 | 4/2013 | Nowak et al. | |
| 2013/0162996 A1 | 6/2013 | Straaijer et al. | |
| 2015/0003102 A1 | 1/2015 | Kong | |
| 2015/0029754 A1 | 1/2015 | Ouderkirk et al. | |
| 2016/0161863 A1 | 6/2016 | Den Boef et al. | |
| 2016/0282282 A1 | 9/2016 | Quintanilha et al. | |
| 2016/0370717 A1 | 12/2016 | Den Boef et al. | |
| 2017/0184981 A1 | 6/2017 | Quintanilha et al. | |
| 2019/0385760 A1 | 12/2019 | Zijp | |

FOREIGN PATENT DOCUMENTS

| | | |
|---|---|---|
| JP | 2005-234573 A | 9/2005 |
| JP | 2011-238904 A | 11/2011 |
| JP | 2017-037002 A | 2/2017 |
| TW | 2006-06391 A | 2/2006 |
| TW | 2006-26829 A | 8/2006 |
| TW | 2007-00927 A | 1/2007 |
| TW | M311850 U | 5/2007 |
| TW | 2013-37415 A | 9/2013 |
| WO | WO2011/012624 A1 | 2/2011 |

OTHER PUBLICATIONS

A.T.H. Beaucamp and Y. Namba, "Technological Advances in Super Fine Polishing", Proc of the 14th EU Soc Free Eng and Nano Tech (2014).

Y. Mori et al., "Elastic emission machining", Precision Engineering, vol. 9, No. 3, p. 123-128 (1987).

K. Yamauchi et al., "Figuring with subnanometer-level accuracy by numerically controlled elastic emission machining", Rev Sci Instr, vol. 73, No. 11, p. 4028-4033 (2002).

Satoru Egawa et al., "Evaluation of figure accuracy of Wolter mirror fabricated by electroforming", Proc. SPIE9687, p. 968705-1-6 (2016).

Kwon Su Chon et al., "Precision Machining of Electroless Nickel Mandrel and Fabrication of Rep Heated Mirrors for a Soft X-ray Microscope", JSMEInt J. C 49(1), p. 56-62 (2006).

P. Friedrich et al., "Design and developmentofthe eROSITA x-ray mirrors", Proc. SPIE 7011, p. 70112T (2008).

Hans Wolter, "Spiegelsysteme streifende Einfalls als abbildende Optiken fur Rontgenstrahlen", Annalen derPhysik, vol. 445, Issue 1-2, p. 94-114 (1952).

Paul Kirkpatrick and AV. Baez, "Formation ofOptical Images by X-ray s", JOSA, vol. 38, No. 9, p. 766-774 (1948).

International Search Reportand Written Opinion of the International Searching Authority directed to related International Patent Application No. PCT/EP2019/063352, dated Aug. 29, 2019; 10 pages.

International Preliminary Report on Patentability directed to related International Patent Application No. PCT/EP2019/063352, dated Dec. 15, 2020; 6 pages.

Non-Final Rejection directed to related U.S. Appl. No. 16/440,099, dated Oct. 8, 2020; 13 pages.

Notice of Allowance directed to related U.S. Appl. No. 16/440,099, dated Jun. 1, 2021; 11 pages.

Notice of Allowability directed to related U.S. Appl. No. 16/440,099, dated Jun. 10, 2021; 2 pages.

Final Rejection directed to related U.S. Appl. No. 16/440,099, dated Jan. 27, 2021; 13 pages.

* cited by examiner

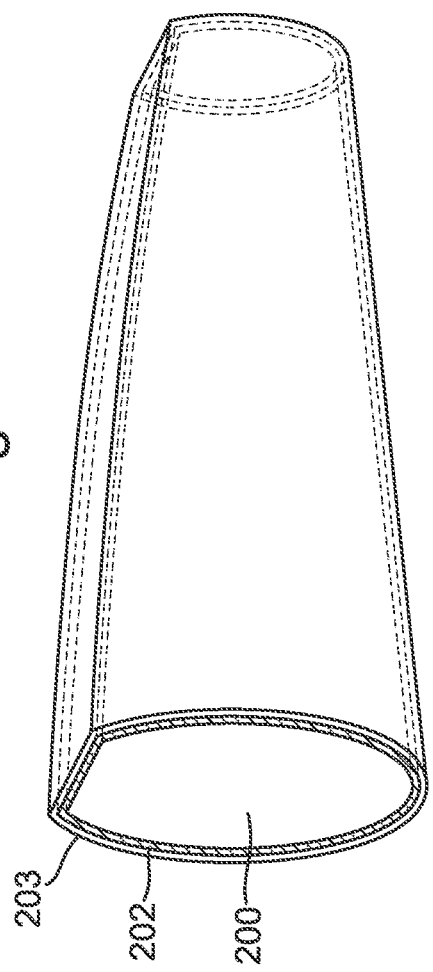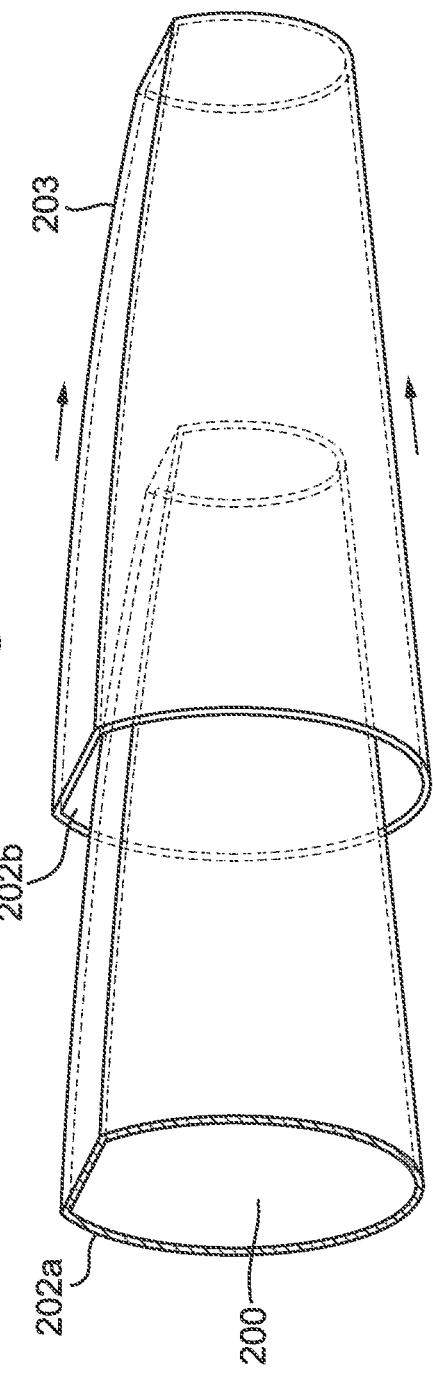

REFLECTOR AND METHOD OF MANUFACTURING A REFLECTOR

CROSS REFERENCE TO RELATED APPLICATIONS

This application is a divisional application of U.S. patent application Ser. No. 16/440,099, filed on Jun. 13, 2019, which claims priority to European Patent Application 18178127.9, filed on Jun. 15, 2018, the entire contents of all of which are incorporated herein by references.

FIELD

The present invention relates to reflectors and methods of manufacturing reflectors, especially oblique incidence and grazing incidence reflectors for hard X-rays, soft x-rays, EUV radiation and/or neutrons.

BACKGROUND

There is a continuing desire to manufacture devices, e.g. integrated circuits, with ever smaller features. Integrated circuits and other microscale devices are often manufactured using optical lithography, but other manufacturing techniques, such as imprint lithography, e-beam lithography and nano-scale self assembly are known. However a device is manufactured, it is often necessary to inspect it. It may also be necessary to inspect to ols or components, such as masks or reticles, used in manufacturing processes. For features of smaller dimensions, radiation of shorter wavelengths must be used. Therefore, inspection tools using very short wavelength radiation, e.g. in the EUV or soft X-ray (SXR) ranges, are desirable.

Radiation in the EUV and SXR ranges is difficult to direct or focus as it is not possible to construct a refractive optical element for such wavelengths. Direction and focusing of EUV and soft X-rays has to be performed using reflectors, often grazing incidence reflectors. Because of the very short wavelengths of EUV and soft X-ray radiation, figure error and surface roughness requirements of reflectors of such radiation are very strict in order to focus light with low wavefront aberrations and flare from surface scatter due to surface roughness. Therefore manufacturing of reflectors for EUV and/or soft X-rays is difficult, expensive, and/or time-consuming.

SUMMARY

A reflector for hard X-rays, soft x-rays, EUV radiation and/or neutrons that is easy to manufacture and has a low figure error and/or small surface roughness is desirable.

A method of manufacturing reflectors for hard X-rays, soft x-rays, EUV radiation and/or neutrons that can achieve strict figure error and/or surface roughness limits and is quicker and/or cheaper is also desirable.

According to the invention, there is provided a reflector comprising a hollow body having an interior surface defining a passage through the hollow body, the interior surface having at least one optical surface part configured to reflect radiation and a supporter surface part, wherein the optical surface part has a predetermined optical power and the supporter surface part does not have the predetermined optical power.

According to the invention, there is provided a method of manufacturing a reflector, the method comprising:
providing an axially symmetric mandrel;
shaping a part of the circumferential surface of the mandrel to form at least one inverse optical surface part that is not rotationally symmetric about the axis of the mandrel;
forming a reflector body around the mandrel; and
releasing the reflector body from the mandrel whereby the reflector body has an optical surface defined by the inverse optical surface part and a supporter surface part defined by the rest of the outer surface of the mandrel.

According to the invention, there is provided a mandrel for manufacturing a reflector, the outer surface of the mandrel having a first surface part that conforms to an axially symmetric figure and an inverse optical surface part that is within the axially symmetric figure and corresponds to an optical surface having a predetermined optical power.

BRIEF DESCRIPTION OF THE DRAWINGS

Embodiments of the invention will now be described, by way of example only, with reference to the accompanying schematic drawings, in which:

FIG. 7 depicts a shell deposited on the mandrel;

FIG. 8 depicts removing the shell from the mandrel;

EXEMPLARY EMBODIMENTS

Figure 1:
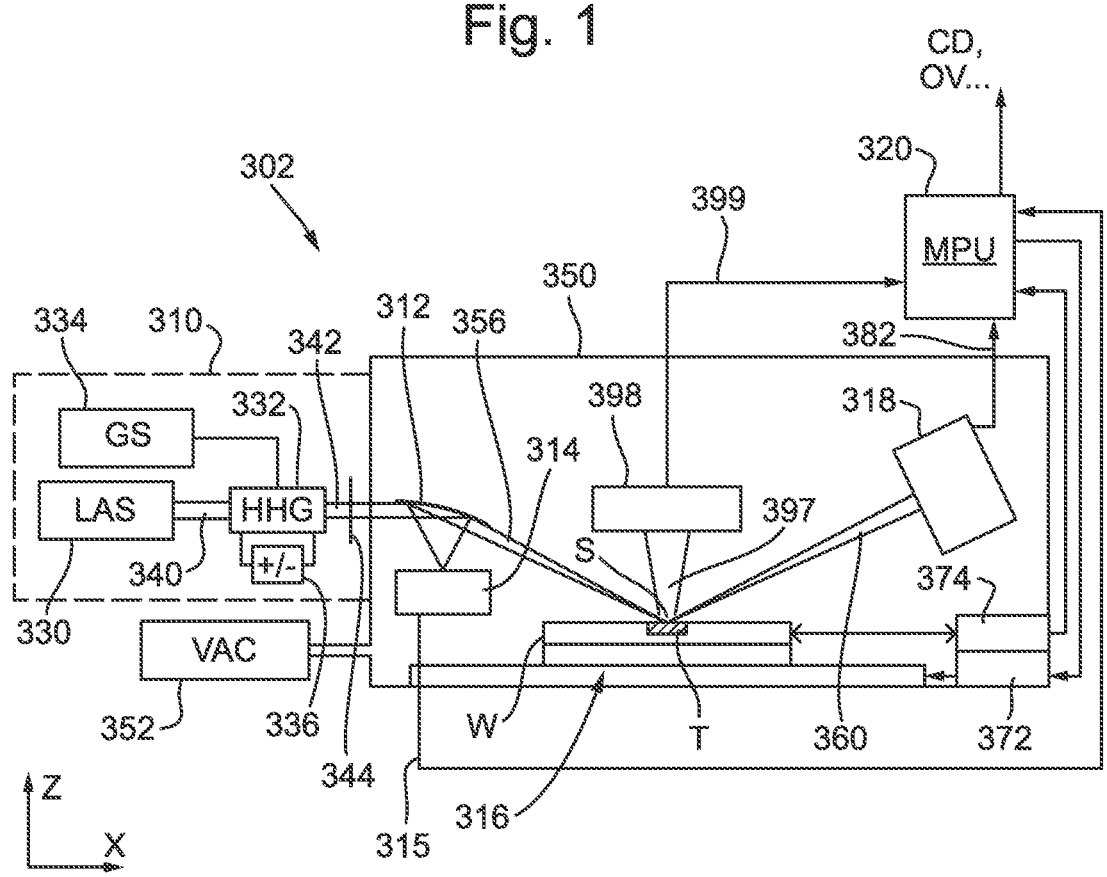
FIG. 1 depicts a schematic overview of a metrology apparatus.

FIG. 1 depicts a schematic representation of a metrology apparatus 302 in which radiation in the wavelength range from 0.1 nm to 100 nm may be used to measure parameters of structures on a substrate. The metrology apparatus 302 presented in FIG. 1 is suitable for the soft X-rays or EUV domain.

FIG. 1 illustrates a schematic physical arrangement of a metrology apparatus 302 comprising a spectroscopic scatterometer using EUV and/or SXR radiation, purely by way of example. An alternative form of inspection apparatus might be provided in the form of an angle-resolved scatterometer.

Inspection apparatus 302 comprises a radiation source 310, illumination system 312, substrate support 316, detection systems 318, 398 and metrology processing unit (MPU) 320.

Source 310 in this example comprises a generator of EUV or soft x-ray radiation based on high harmonic generation (HHG) techniques. Alternatives to the HHG source are the Discharge Produced Plasma (DPP) source, the Free Electron Laser (FEL) source, the Inverse Compton Scattering (ICS) source or a compact synchrotron. HHG sources are available for example from KMLabs, Boulder Colo., USA (http://www.kmlabs.com/). Main components of the radiation source are a drive laser 330 and an HHG gas cell 332. A gas supply 334 supplies suitable gas to the gas cell, where it is optionally ionized by an electric source 336. The drive laser 300 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). The laser pulses are delivered as a first radiation beam 340 to the HHG gas cell 332, where in the gas a portion of the radiation is converted to higher frequencies than the first radiation to form a beam 342 including coherent second radiation of the desired wavelength or wavelengths.

The second radiation may contain multiple wavelengths. If the radiation were monochromatic, then measurement calculations (for example reconstruction of the structure of interest) may be simplified. The volume of gas within the gas cell 332 defines an HHG space, although the space need not be completely enclosed and a flow of gas may be used instead of a static volume. The gas may be for example a noble gas such as neon (Ne) or argon (Ar). $N_2$, $O_2$, He, Ar, Kr, Xe gases, or mixtures thereof, can also be used. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) may serve to cut the fundamental IR radiation from passing further into the inspection apparatus. A grating (not shown) may be provided to select one or more specific harmonic wavelengths from among those generated in the gas cell. Some or all of the beam path may be contained within a vacuum environment, bearing in mind that SXR radiation is absorbed when traveling in air. The various components of radiation source 310 and illumination optics 312 can be adjustable to implement different metrology 'recipes' within the same apparatus. For example different wavelengths and/or polarization can be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 1-20 nm or optionally in the range 1-10 nm or optionally in the range 10-20 nm may be chosen. Wavelengths shorter than 5 nm suffer from very low critical angle when reflecting off materials typically of interest in semiconductor manufacture. Therefore choosing a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labeled T. The gas pressure within inspection chamber 350 is maintained near vacuum by vacuum pump 352, so that EUV radiation can pass through the focusing system without undue attenuation. The illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety). The focusing is performed to achieve a round or elliptical spot S less than approximately 10 μm in diameter, when projected onto the structure of interest. This can be achieved by directly imaging the source onto an image plane or by imaging a small aperture, which is irradiated by the source, onto an image plane. Substrate support 316 comprises for example an X-Y-Z translation stage and a rotation stage, by which any part of the substrate W can be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to metrology processing unit 320 processor 310 and the filter may comprise information about the spectrum of the filtered beam 342 and/or the intensities of the different wavelengths in the filtered beam.

Reflected radiation 360 is captured by detector 318 and a spectrum 382 is provided to processing unit 320 for use in calculating a property of the target structure T. The illumination system 312 and detection system 318 thus form an inspection apparatus. This inspection apparatus may comprise a soft X-ray and/or EUV spectroscopic reflectometer of the kind described in US2016 282282A1 which content is incorporated herein by reference in is entirety.

If the target T has a certain periodicity, the radiation of the focussed beam 356 may be partially diffracted as well. The diffracted radiation 397 follows another path at well-defined angles with respect to the angle of incidence then the reflected radiation 360. In FIG. 1, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 1 a single further detection system 398 is drawn, but embodiments of the inspection apparatus 302 may comprise a plurality of further detection systems 398 that are arranged at different position to detect and/or image diffracted radiation 397 at a plurality of diffraction directions. In other words, the (higher) diffraction orders of the focussed radiation beam that impinges on the target T are detected and/or imaged by one or more further detection systems 398. The one or more detection systems 398 generate a signal 399 that is provided to the metrology processing unit 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 can also communicate with a position controller 372 which operates the translation stage, rotation and/or tilting stages. Processor 320 receives highly accurate feedback on the position and orientation of the substrate, via sensors. Sensors 374 may include interferometers, for example, which can measure the portion of the substrate support 316 with an accuracy in the region of picometers (pm). In the operation of the inspection apparatus 302, spectrum data 382 captured by detection system 318 is delivered to metrology processing unit 320.

The inspection apparatus uses soft X-ray and/or EUV radiation at any suitable incidence, e.g. normal incidence, near-normal incidence or grazing incidence, for example to perform diffraction-based measurements of asymmetry. The angle of incidence may also be in the range from 20 to 40 degrees, for example, 30 degrees. The inspection apparatus can be provided in a hybrid metrology system. Performance parameters to be measured can include overlay (OVL), critical dimension (CD) Via Contact Landing (a combination of CD and OVL) and CD uniformity (CDU). Measurement techniques can include coherent diffraction imaging (CDI) and at-resolution overlay (ARO) metrology. The soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

The inspection apparatus 302 can be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus including thin layer deposition and ion implantation (doping) equipment.

Manufacturing the reflectors used in illumination system 312 is difficult, expensive and/or time consuming because a high degree of flatness is required to minimise flare. It is desirable that the illuminator is able to focus more than 99% of the radiation in a metrology target on the wafer with dimensions between approximately 2×2 µm$^2$ and 40×40 µm$^2$. To achieve this it is desirable that the relevant surface roughness of the reflectors be better than 100 pm RMS, optionally better than 50 pm RMS and most optionally better than 35 pm RMS. The relevant RMS surface roughness is obtained by integration of the power spectral density (PSD) of a measured surface profile. The surface profile is measured according to standard SEMI MF1811 "GUIDE FOR ESTIMATING THE POWER SPECTRAL DENSITY FUNCTION AND RELATED FINISH PARAMETERS FROM SURFACE PROFILE DATA", which also describes the signal processing to derive the PSD from the measured surface profile. The RMS surface roughness is obtained by integrating the PSD from spatial frequency equal to zero to the spatial frequency equal to the reciprocal of the shortest radiation wavelength of interest. The PSD is often obtained by combing measurement data from multiple instruments with different resolution and scan lengths such as Long Trace Profilers, full aperture interferometry, sub-aperture stitching interferometry, White Light Interferometric microscopy (WLI) and atom force microscopy (AFM).

A known technique for manufacture of axially symmetric grazing incidence (soft) X-ray mirrors, uses electro-deposition replication techniques to create thin, full-shell, tubular mirrors. The electro-deposition essentially copies the surface roughness from the mandrel. However, known methods only make axially symmetric reflectors.

Figure 2:
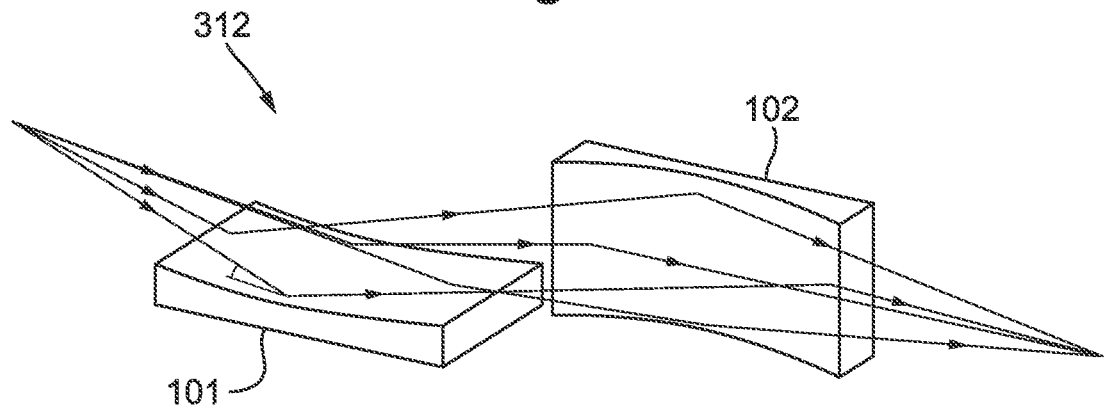
FIG. 2 is a schematic depiction of a Kirkpatrick-Baez crossed mirror pair.
Figure 3:
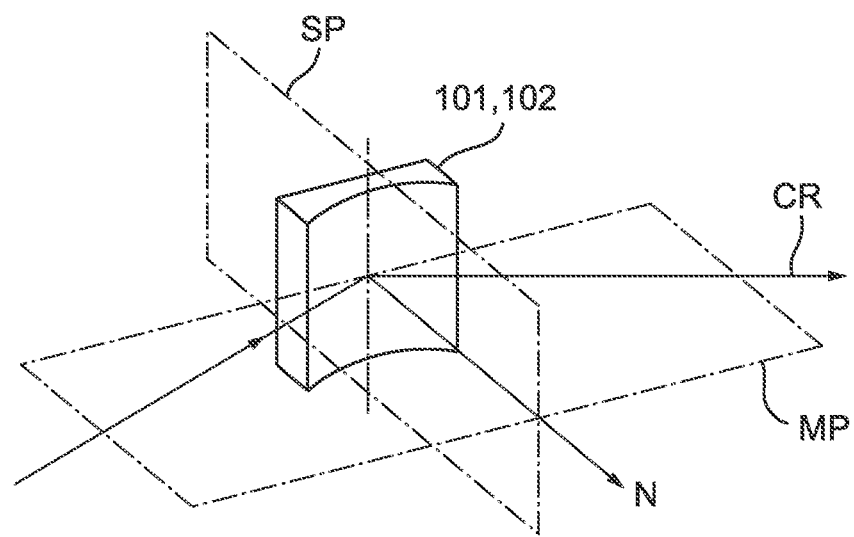
FIG. 3 illustrates meridian and sagittal planes of a reflector.

In an embodiment of the invention, illumination system 312 comprises one or two Kirkpatrick-Baez crossed mirror pairs 101, 102 as depicted in FIG. 2. These mirrors are curved in the meridian plane (the plane containing the chief ray and the mirror surface normal at the intersection point of the chief ray) with little or no curvature in the sagittal plane (the plane perpendicular to the meridian plane). The meridian plane MP and sagittal plane SP are illustrated in FIG. 3. In the meridian plane MP the curvature of the mirrors 101, 102 often follows a segment of an ellipse. Because large radii of curvature in the sagittal plane, e.g. greater than 500 mm, are required for these mirrors, a full-shell, tubular mirror would be impractically large.

A conventional approach to manufacturing reflectors for an EUV or soft x-ray inspection apparatus involves polishing a blank to the desired figure and degree of flatness. This can take a very long time and is expensive.

An embodiment of the present invention provides a method of manufacturing a full-shell replicated optical element which combines the advantages of freedom of optical design and extremely low surface roughness achievable using super polishing techniques with low cost from replication, and stiffness of a compact full-shell electro-deposited grazing incidence mirror.

Figure 4:
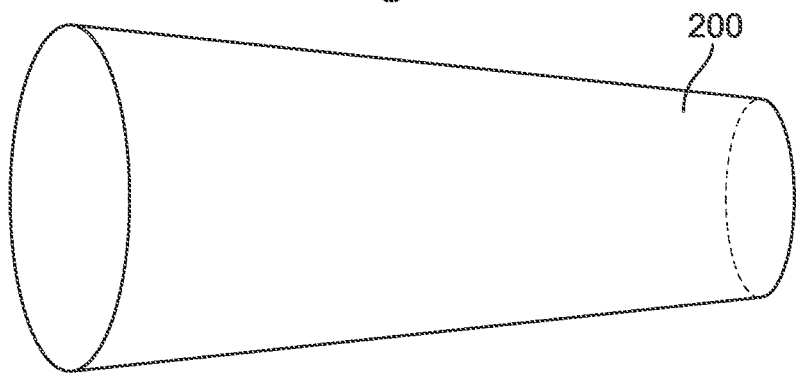
FIG. 4 depicts an axially symmetric mandrel as the starting point for a method according to the invention.

A method according to the invention is depicted in FIGS. 4 to 9. As depicted in FIG. 4, a frusto-conical preform of a suitable material, for example crystalline silicon, glass or a glass-ceramic, is provided. The preform need not be strictly conical but should have a cross section that monotonically decreases along its axis, i.e. has no bulges or dips. The preform can be made in the desired shape by conventional techniques, such as diamond turning or grinding and polishing. The surface roughness of the preform is not crucial to the functioning of the invention. The preform need not be axially symmetric but it is easier to make an axially symmetric preform and the axial symmetry will contribute to the stiffness of the final product.

Figure 5:
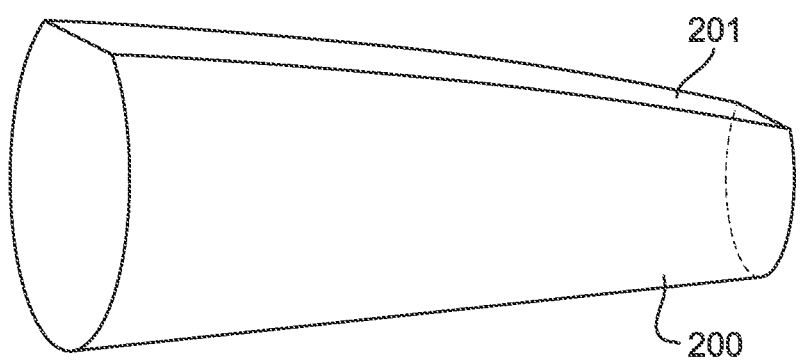
FIG. 5 depicts an inverse optical surface formed on the mandrel on FIG. 4.

Next, an inverse optical surface is formed on the preform 200, as shown in FIG. 5, by removing material from one side. The inverse optical surface can be formed with a two step process wherein conventional grinding techniques are used to achieve a figure close to the desired end figure and then a super polishing technique is used to achieve the finally desired figure (within desired figure error limits) and degree of roughness. The inverse optical surface optionally has a roughness less than 100 pm RMS, optionally less than 50 pm RMS, optionally less than 35 pm RMS. The shape of the inverse optical surface is the inverse of the surface of the reflector that is to be manufactured. Suitable super polishing techniques that can be used in the invention include: Magneto-Rheological Fluid Finishing (MRF), Fluid Jet Polishing (FJP), Elastic Emission Machining (EEM), Ion Beam Figuring and Float Polishing.

The inverse optical surface 201 is arranged such that the meridian plane of the reflector ultimately manufactured includes the axis of the original preform. Therefore, any desired curvature for this plane can easily be achieved. The sagittal plane of the end reflector is perpendicular to the axis of the optical preform and can have a much larger radius of curvature. The final reflector can be flat in the sagittal plane or even negatively curved such that a reflector cross section in the sagittal plane is slightly concave. The inverse optical surface can have curvatures that are non-constant over the optical surface, i.e. they do not need to be flat or segments of a circle but they can also be other segments of conic cross sections, of polynomial form or essentially freeform.

Figure 6:
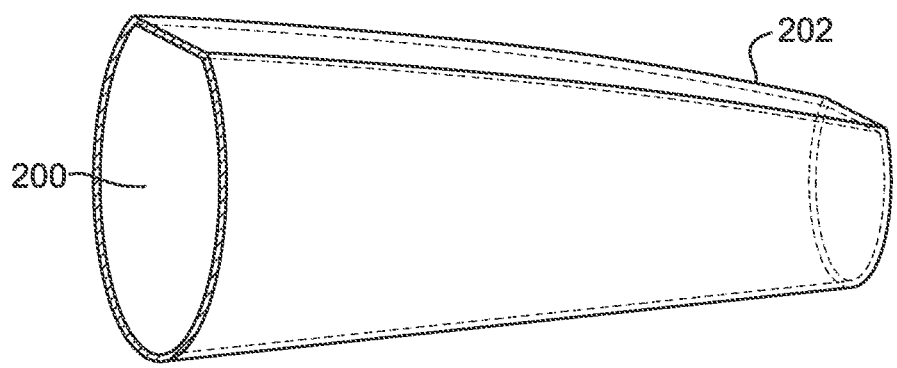
FIG. 6 depicts coating the mandrel with a release layer.

As shown in FIG. 6, a thin layer 202 is coated on the entire outer surface of the mandrel 200 with a thickness of approximately 100 nm. This layer 202 functions as an electrode during an electrodeposition process and also functions as a release layer A suitable release layer depends upon the materials used for the mandrel and for the to be formed mirror. In an embodiment gold, chromium or platinum can be used as the electrode and release layer. In some cases the release layer might not be necessary or may be covered by a second thin layer of e.g. nickel (also of approximately 100 nm thickness) to facilitate the electrodeposition of a thicker layer of stress-free nickel.

Next, an outer shell 203 is formed around the mandrel 200, on top of release layer 202, as shown in FIG. 7. The shell can be formed, for example, by electro-deposition. In an embodiment, the shell is formed by depositing a low-stress nickel layer of a few hundred μm by submersing the mandrel in a nickel sulfamate ($Ni(SO_3Na_2)_2$) bath.

Other techniques can be used to form a shell. For example, the shell can be formed of a resin which is applied to the mandrel and cured using known techniques. Another possibility is to form the shell from glass or a thermoplastic polymer. To achieve this, a heated glass tube of diameter slightly larger than the mandrel is placed around the mandrel. The space between the glass tube and the mandrel is evacuated so that external pressure forces the heated glass tube to conform to the shape of the mandrel and in particular the inverse optical surface. The glass shell is then cooled so as to take a permanent shape defined by the mandrel. A similar process can be followed in which the initial tube is made from a thermoplastic polymer instead of glass.

Once the full shell 203 has been formed, it is removed from the mandrel 200 by sliding it in the direction of the smaller end of the mandrel as shown in FIG. 8. This can be assisted by heating or cooling the mandrel and/or the shell, taking advantage of any differences in coefficient of thermal expansion between the material of the mandrel and the material of the shell to release the shell from the mandrel. If the coefficient of thermal expansion of the mandrel is equal to or greater than that of the shell, release can be achieved by heating the shell whilst cooling the mandrel. It is desirable that any heating or cooling of the shell and the mandrel is minimised to avoid distortion of its shape through thermal hysteresis. The release layer 202 also assists in this process and in some cases residue 202a, 202b of the release layer may remain on both the exterior surface of the mandrel 200 and the interior surface of the shell 203. The mandrel can be used again to form another mirror, after any necessary cleaning. Thus the time-consuming and expensive step of super polishing to form the inverse optical surface need only be done once yet many reflectors can be made using the mandrel.

Figure 9:
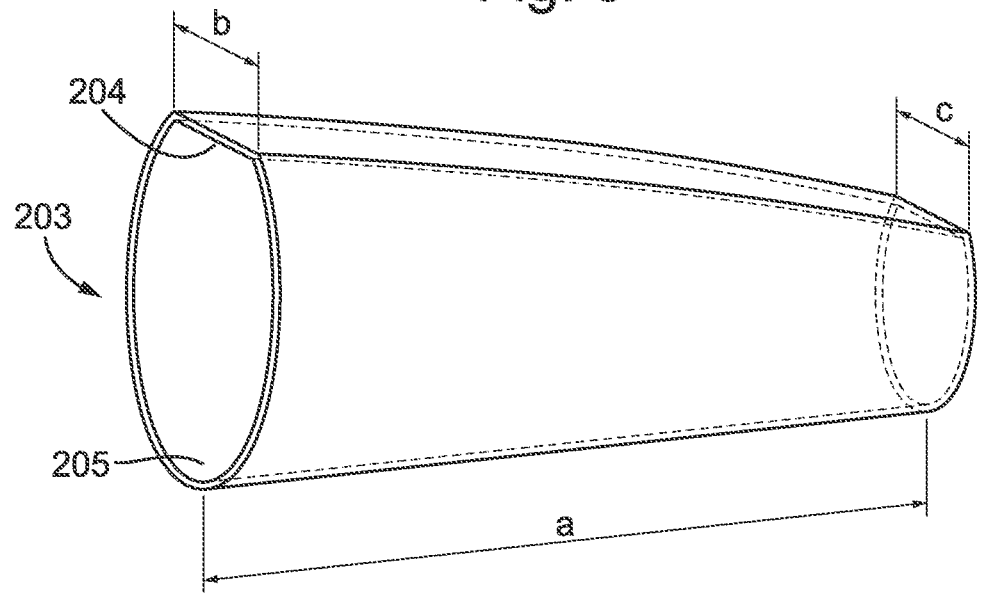
FIG. 9 depicts the interior of the shell coated with a reflective layer.

FIG. 9 now depicts the shell 203 separated from the mandrel. Its interior surface has two parts, an optical surface part 204 and a non-optical surface part 205. The optical surface part 204 has the desired surface figure as defined by the inverse optical surface 201 formed on the mandrel. The non-optical surface part 205 has the shape of the original preform and its function is to support the optical surface part hence it may be referred to as a supporter surface part. The optical surface part 204 has a predetermined optical power in the meridian direction (in other words it converges, diverges or otherwise modifies the reflected radiation) whereas the non-optical surface 205 may have no optical power or a different optical power. In an embodiment, the specular reflectivity of the non-optical surface part is much less than that of the optical surface part, e.g. less than 50% of the specular reflectivity of the optical surface part. In an embodiment the optical surface part 204 is concave. It is possible to make convex surfaces also but the degree of taper of the preform may need to be increased to ensure the shell can be released if the curvature of the optical surface part is large.

Shell 203 is a hollow body, with a central passage through which radiation can propagate. The radius of curvature in the sagittal plane (i.e. perpendicular to the axis of the passage) of the optical surface part (referred to as the first radius of curvature) is determined by the desired optical properties of the reflector and is generally large, even infinite. The radius of curvature in the sagittal plane (i.e. perpendicular to the axis of the passage) of the non-optical surface part (referred to as the second radius of curvature) is determined by the physical properties of the shell, e.g. stiffness and size, and is generally smaller that the first radius of curvature.

The optical surface part 204 can be provided with a reflection enhancing coating, e.g. or gold or ruthenium, if desired. Such a coating can be applied selectively to the optical surface part 204 or to the whole of the interior surface of the shell and even to the outer surface, e.g. if that is easier than a selective coating. The coating thickness need not be large so the material cost is not high even if the whole shell is coated. In an embodiment, the reflector has a reflectivity at grazing incidence to at least one wavelength in the soft x-ray or EUV range of greater than about 70%, optionally greater than about 80%.

The optical surface part 204 (after any coating is applied) has the desired low surface roughness whereas the non-optical surface part 205 does not need to have a particular surface roughness and therefore may have a higher surface roughness. The roughness of the non-optical surface part should not hinder removal of the shell from the mandrel. Because the non-optical surface part does not need to have an especially low surface roughness, the amount of time-consuming and expensive super-polishing required is minimised. Roughness that can be achieved with, for example, diamond turning is sufficient for the non-optical surface.

The radius of curvature of the optical surface part 204 in a sagittal plane (perpendicular to the axis of the shell 203) is greater than the radius of curvature of the non-optical surface part 205 in the same plane. In an embodiment, the radius of curvature of the optical surface part in the sagittal plane, and/or the meridian plane, is greater than 500 mm. Because the non-optical part part has a smaller radius of curvature, it provides strength and especially stiffness to the mirror without making the mirror excessively large or heavy.

Optionally, the cross-section of the non-optical surface in a sagittal plane (perpendicular to the axis of the shell) subtends an angle greater than 180° at the axis of the non-optical surface part (corresponding to the axis of the original preform). In other words the cross-section of the non-optical surface is an arc that is more than a semi-circle. With such an arrangement the non-optical surface part of the shell is stiff and provides plenty of room for beam paths.

If necessary, it is possible to correct any figure error of the optical surface part 204 by ion beam sputtering deposition.

Figure 10:
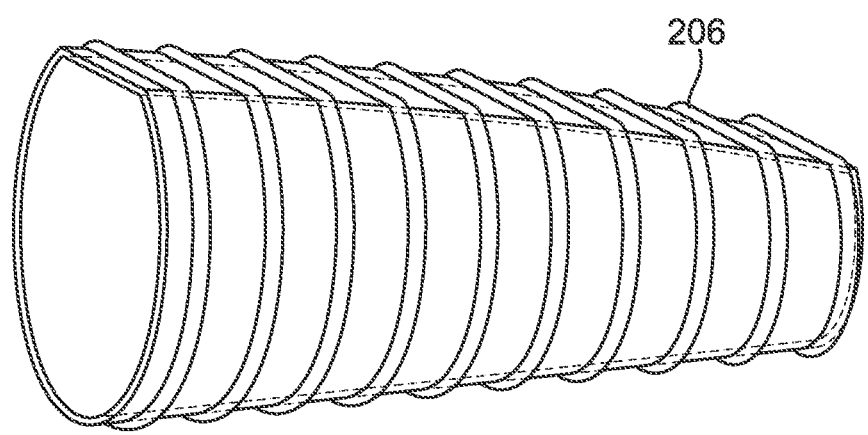
FIG. 10 depicts reinforcements provided on the exterior of the shell.
Figure 11:
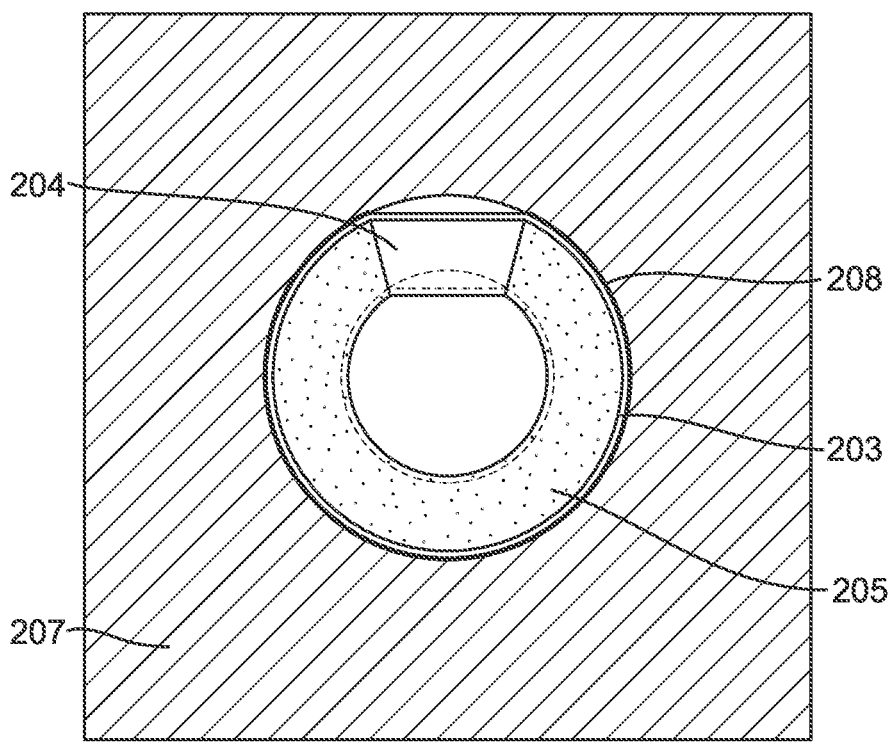
FIG. 11 depicts the shell placed in a reinforcement.
Figure 12:
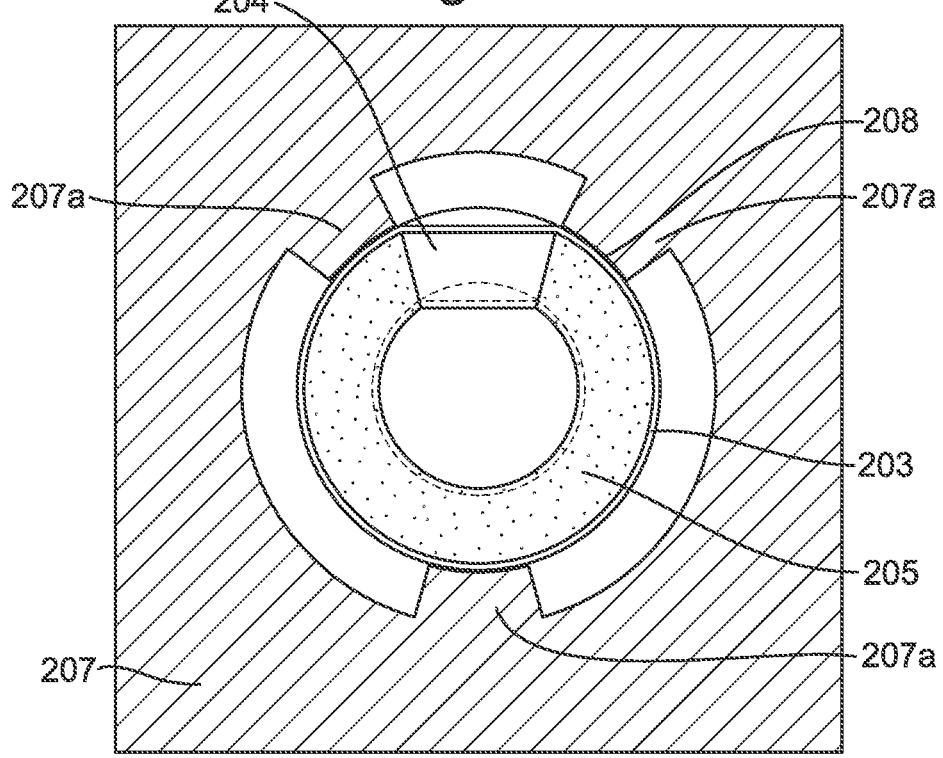
FIG. 12 depicts the shell placed in an alternative form of reinforcement.

If desired, reinforcement can be added to the full shell reflector. Two types of reinforcement are depicted in FIGS. 10, 11 and 12. FIG. 10 shows ribs 206 provided on the outside of the shell in the region of the optical surface and extending circumferentially. Ribs 206 can be formed of resin, metal or any other material compatible with the material of the shell and having suitable mechanical properties. Ribs can be arranged transversely, diagonally and/or longitudinally in addition to or instead of circumferentially. Ribs can be provided on the outside of the non-optical surface part outside of the optical surface part or both. The pattern of ribs is easily designed to provide any necessary strength and support.

In FIG. 11, the full shell reflector is shown mounted in a holder 207 which is axially symmetric and corresponds to the outer shape of the original preform. The full shell reflector is fixed to holder 207 using low stress adhesive 208. Holder 207 can be a framework rather than a hollow body. Holder 207 can have reinforcing ribs as described above. Use of a holder 207 can simplify manufacture as the full-shell reflector is easily inserted into a separately manufactured holder. A variant holder 207 is shown in FIG. 12. In this example, holder 207 has a plurality of projections 207a which contact and support the reflector 204 over only part of its outer surface.

Reinforcement of any type can be added to the full-shell reflector either before or after it is removed from the mandrel. Adding reinforcement whilst the full-shell reflector is still on the mandrel has the advantage that the mandrel maintains the shape of the optical surface whilst the reinforcement is added and the reinforcement can be used to engage and support the full-shell reflector during the removal process. Additive manufacturing techniques of various types are useful for adding the reinforcement.

Figure 13:
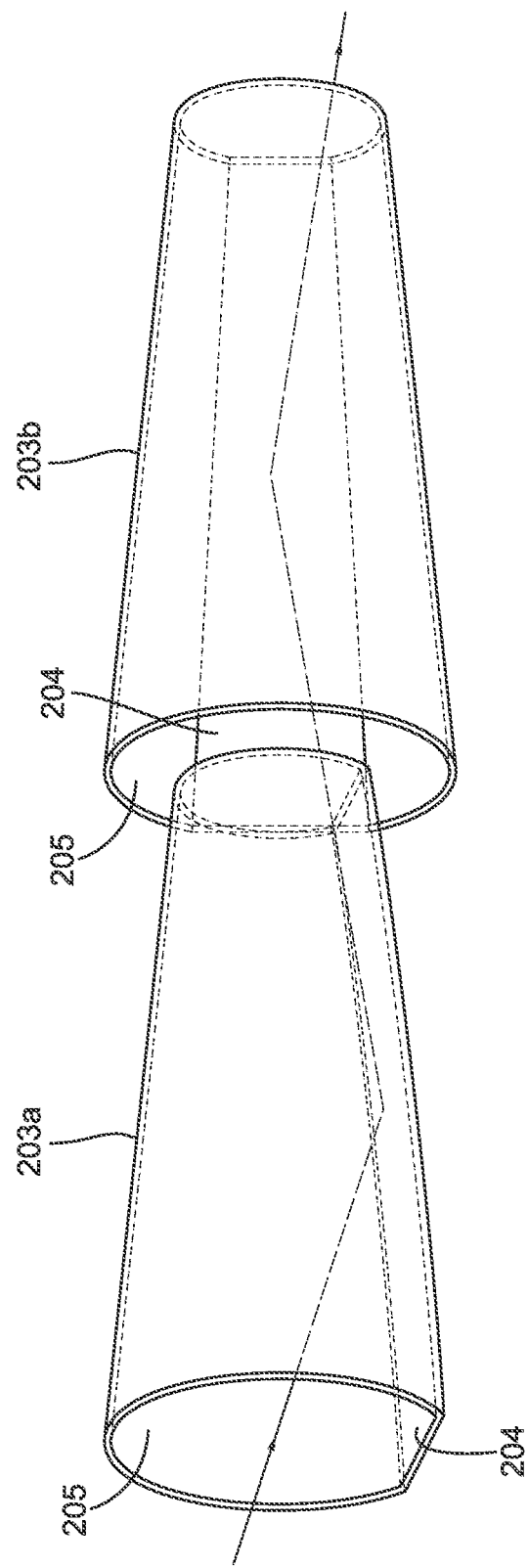
FIG. 13 depicts two reflectors manufactured according to the invention forming a Kirkpatrick-Baez mirror pair.

FIG. 13 shows two full-shell reflectors 203a, 203b configured as a Kirkpatrick-Baez crossed mirror pair for use in the illumination system of an inspection apparatus, such as metrology apparatus. The curvature of the optical surface parts 204 is not shown to scale. Depending on the required curvature of the optical surfaces and beam angles, the full-shell reflectors 203a, 203b may be oriented differently, e.g. with both narrow ends adjacent. Since the reflectors are grazing-incidence reflectors, beam angles are low and the non-optical surface parts 205 will not usually interfere with the beam path. However, if necessary parts of the non-optical surface can be cut away to avoid occluding the beam or to avoid interference with other components of the apparatus.

If the support of the non-optical surface part is not required, it is possible to completely separate the optical surface 203 from the non-optical surface part 205 to provide a stand-alone mirror. Such a mirror retains the advantage of being manufacturable quickly and cheaply even if the advantage of the support provided by the non-optical surface is not taken. If it is intended to remove the non-optical surface part, the mandrel can be formed with more than one inverse optical surface to allow manufacture of multiple reflectors simultaneously.

It is also possible, and sometimes desirable, to have more than one optical surface in a single shell in which case more than one inverse optical surface is formed on a single mandrel. A shell having more than one optical surface can be considered an optical system rather than an optical element. In such an optic the light reflects more than once. An example of such optics is the Wolter type optic where the first and second optical surfaces are axially aligned on one side of the shell. The two optical surfaces may be spaced apart or abutting. Depending on the surface figures, there may or may not be a detectable boundary between optical surfaces. There can be a transitional zone between optical surfaces. Two adjacent optical surfaces can be considered parts of a larger free-form surface. In another example, the optical surfaces are arranged around the circumference of the shell, e.g. on opposite sides thereof.

In an embodiment, the optical surface of a full shell reflector has a diffraction grating on its surface in addition to the desired surface figure. Such a reflector can be manufactured by the same method as described above except that after the super polishing step, a holographic phase grating is formed on the inverse optical surface of the mandrel. This can be done by performing optical holography in a resist layer on the substrate, developing the resist and reactive ion etching into the mandrel. After cleaning, a ruthenium coating can be applied on the grating.

Release of a full shell from its mandrel may be more difficult when a grating is applied into the mandrel. However, a useful grating may have a depth of no more than 10 nm so that replication and release (using thermal expansion) should be possible without too much trouble.

The method of the invention can be used to manufacture reflectors of a wide range of sizes. The method is particularly suitable to manufacture reflectors where the optical surface has a length (a in FIG. 9) in the range of from 50 mm to 500 mm, optionally 100 mm to 350 mm, and a width (b or c in FIG. 9) in the range of from 10 mm to 100 mm, optionally 30 mm to 60 mm. The radius of the non-optical surface part can be in the range of from 10 mm to 100 mm, optionally 30 mm to 50 mm. The thickness of the shell will depend on the material employed. For an electro-deposited metal shell a thickness of 100 μm or 200 μm or more is sufficient.

Reflectors according to the invention can be used in all types of metrology apparatus, including angular resolved scatterometers, spectroscopic scatterometers and ellipsometric scatterometers. Such apparatus can be used to measure a variety of parameters of a device or process, including overlay, focus, dose, critical dimension (CD), critical dimension uniformity (CDU), sidewall angle (SWA), conformal layer thickness, via contact landing etc.

Reflectors according to the invention can also be used in a wide variety of other apparatus, including soft or hard X-ray or neutron telescopes, soft or hard X-ray or neutron sources and soft or hard X-ray or neutron beamlines (e.g. using synchrotrons), soft or hard X-ray or neutron diffraction apparatus, or semiconductor mask inspection tools.

Figure 14:
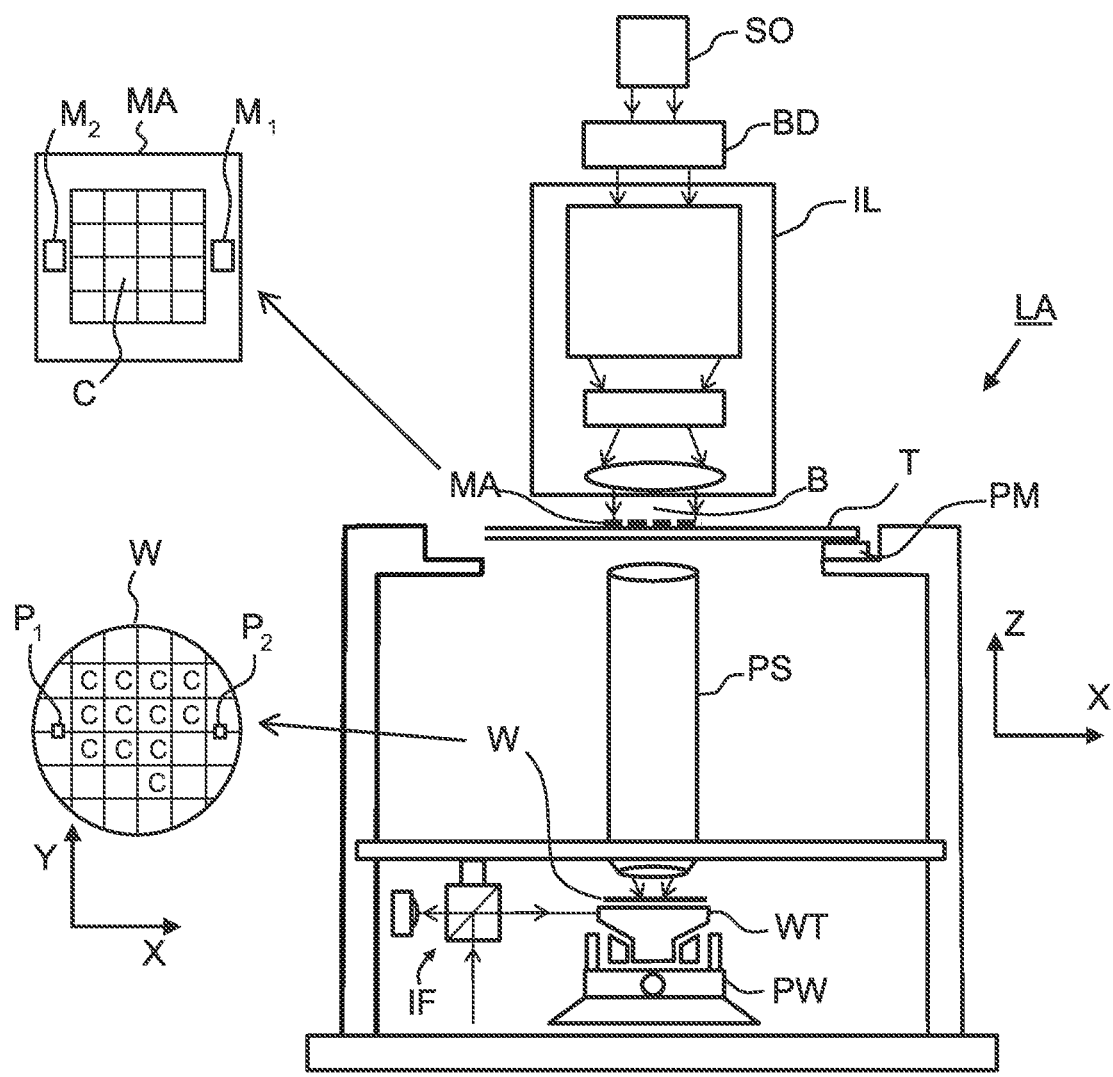
FIG. 14 depicts a lithographic apparatus.
Figure 15:
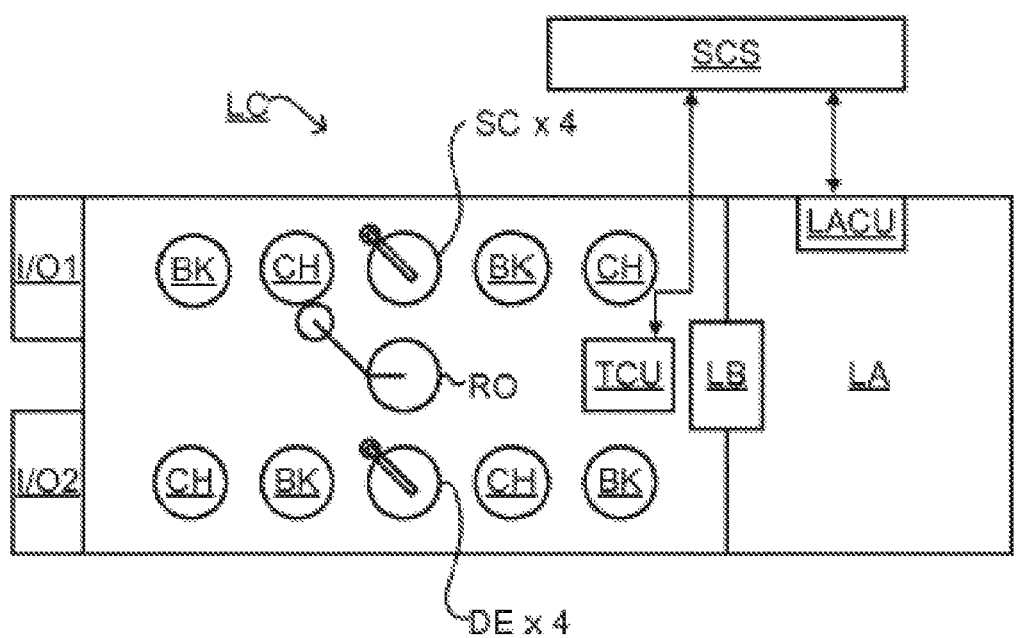
FIG. 15 depicts a lithocell.
Figure 16:
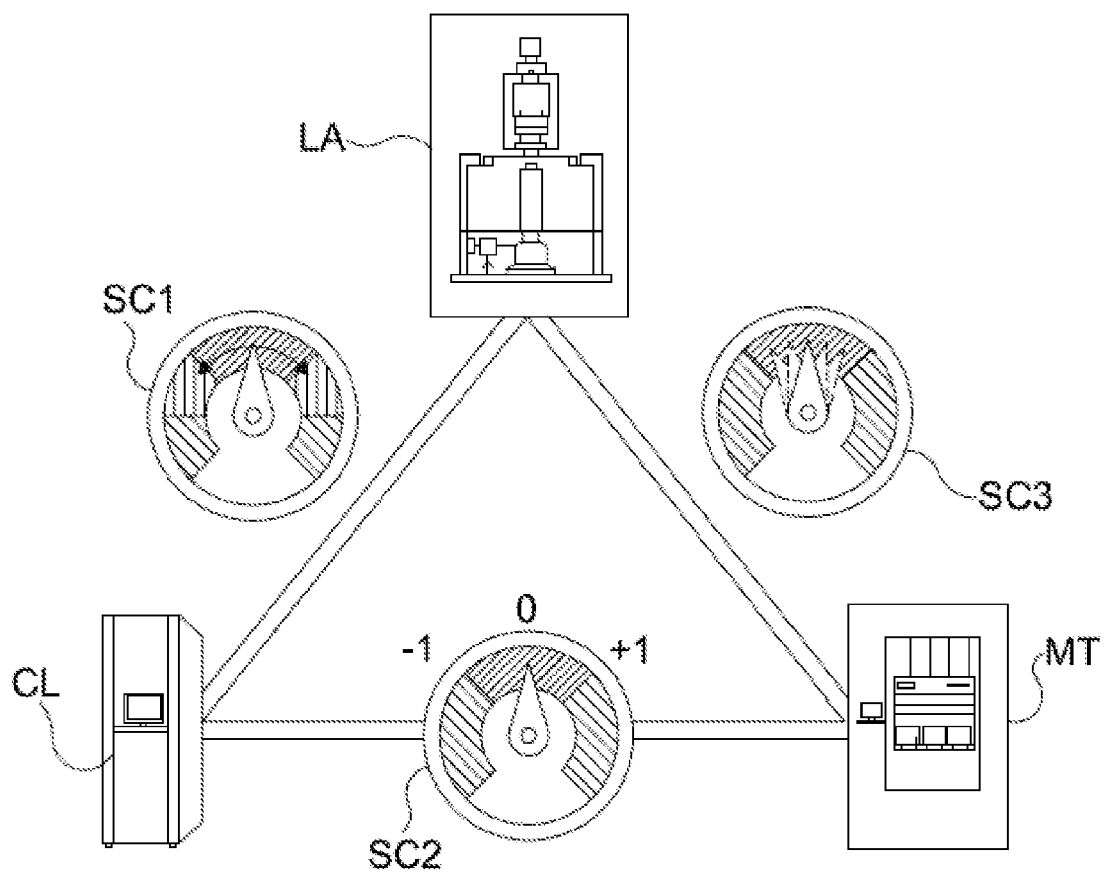
FIG. 16 depicts a method of holistic lithography.

An inspection apparatus comprising an optical system including a reflector according to an embodiment of the invention can form part of a lithocell, which is schematically depicted in FIG. 15. A lithocell is an integrated system comprising a lithographic apparatus, e.g. as schematically depicted in FIG. 14, one or more substrate processing devices or apparatuses, and an inspection apparatus. The lithocell can be configured to perform a process of holistic lithography which takes advantage of a tight control loop as depicted in FIG. 16. The lithographic apparatus, lithocell and holistic lithography process are described below.

FIG. 14 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

As shown in FIG. 15 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Inspection tools are often also referred to as metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is a ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent applications Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 2016/0161863, incorporated herein by reference in its entirety.

Other parameters of interest may be focus and dose. Focus and dose may be determined simultaneously by scatterometry (or alternatively by scanning electron microscopy) as described in US patent application US2011/0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016/0161863 and US patent application US 2016/0370717 A1 incorporated herein by reference in its entirety.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 16. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window.

The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 16 by the multiple arrows in the third scale SC3).

Further embodiments of the invention are provided in the subsequent numbered clauses:

1. A reflector comprising a hollow body having an interior surface defining a passage through the hollow body, the interior surface having at least one optical surface part configured to reflect radiation and a supporter surface part, wherein the optical surface part has a predetermined optical power and the supporter surface part does not have the predetermined optical power.
2. A reflector according to clause 1 wherein the optical surface part or parts have a first roughness and the supporter surface part has a second roughness, the first roughness being smaller than the second roughness.
3. A reflector according to clause 2 wherein the first roughness is less than 100 pm Root Mean Square (RMS), optionally, less than 50 pm RMS, optionally less than 35 pm RMS.
4. A reflector according to clause 1, 2 or 3 wherein the optical surface part has a first radius of curvature in a plane perpendicular to an axis of the passage, and the supporter surface part has a second radius of curvature in the plane, the absolute value of the first radius of curvature being greater than the second radius of curvature.
5. A reflector according to clause 4 wherein the cross-section of the supporter surface part in the plane subtends an angle of greater than 180° at the axis.
6. A reflector according to any one of the preceding clauses wherein the cross-section of the passage monotonically increases from one end thereof to the other end.
7. A reflector according to any one of the preceding clauses further comprising a reflection enhancing layer provided on the optical surface part.
8. A reflector according to any one of the preceding clauses wherein the body comprises a shell formed of a material selected from the group consisting of: nickel, resin, glass and thermoplastic polymers.
9. A reflector according to clause 8 further comprising a reinforcement outside the shell.
10. A reflector according to any one of the preceding clauses wherein the optical surface part has a reflectivity at a grazing incidence of greater than 70% at a wavelength in the range of from 1 nm to 50 nm, optionally greater than 80%.
11. An optical unit comprising two reflectors according to any one of the preceding clauses, wherein the two reflectors are arranged such that one reflector reflects light to the other and the meridian planes of the two reflectors are perpendicular.
12. An inspection apparatus comprising an optical system including a reflector according to any one of clauses 1 to 10 or an optical unit according to clause 11.
13. A method of manufacturing a reflector, the method comprising:
    providing an axially symmetric mandrel;
    shaping a part of the circumferential surface of the mandrel to form at least one inverse optical surface part that is not rotationally symmetric about the axis of the mandrel;
    forming a reflector body around the mandrel; and
    releasing the reflector body from the mandrel whereby the reflector body has an optical surface defined by the inverse optical surface part and a supporter surface part defined by the rest of the outer surface of the mandrel.
14. A method according to clause 13 wherein shaping a part of the outer surface of the mandrel comprises a super polishing step using a process selected from the group consisting of: Magneto-Rheological Fluid Finishing (MRF), Fluid Jet Polishing (FJP), Elastic Emission Machining (EEM), Ion Beam Figuring and Float Polishing.
15. A method according to clause 14 wherein the super polishing step is performed so that the inverse optical surface part has a surface roughness less than 100 pm Root Mean Square (RMS) optionally, less than 50 pm (RMS), optionally less than 35 pm RMS.
16. A method according to any one of clause 13, 14 or 15 further comprising applying a reflection enhancing single or multi-layer coating to the optical surface part of the reflector body.
17. A method according to any one of clauses 13 to 16 further comprising applying an electrode and release layer to the mandrel after the shaping and before the forming.
18. A method according to any one of clauses 13 to 17 further comprising repeating the forming and releasing steps to form a plurality of reflector bodies using the same mandrel.
19. A method according to any one of clauses 13 to 18 further comprising applying a reinforcement to the outside of the reflector body either before or after the releasing.
20. A method according to any one of clauses 14 to 19 wherein forming a reflector body comprises electro-deposition of a metal.
21. A mandrel for manufacturing a reflector, the outer surface of the mandrel having a first surface part that conforms to an axially symmetric figure and an inverse optical surface part that is within the axially symmetric figure and corresponds to an optical surface having a predetermined optical power.

Although specific reference may be made in this text to the use of metrology apparatus in the manufacture of ICs, it should be understood that the apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

Although specific reference is made in this text to "metrology apparatus" or "inspection apparatus", both terms may also refer to an inspection apparatus or an inspection system. For example, the inspection or metrology apparatus that comprises an embodiment of the invention may be used to determine characteristics of structures on a substrate or on a wafer. For example, the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer Although specific reference may be made in this text to embodiments of the invention in the context of a metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

The description above refers to the use of an HHG source. HHG refers to High Harmonic Generation, which is also sometimes referred to as high order harmonic generation. HHG is a non-linear process in which a target, for example a gas, a plasma or a solid sample, is illuminated by an intensive laser pulse. Subsequently, the target may emit radiation with a frequency that is a multiple of the frequency of the radiation of the laser pulse. Such frequency, that is a multiple, is called a harmonic of the radiation of the laser pulse. Harmonics above the fifth harmonic may be referred to as high harmonics and radiation containing them as HHG radiation. The physical process that generates HHG radiation is different from the physical process that relates to generating radiation of the lower harmonics, typically the $2^{nd}$ to $5^{th}$ harmonic. The generation of radiation of the lower harmonics relates to perturbation theory. The trajectory of the (bound) electron of an atom in the target is substantially determined by the Coulomb potential of the host ion. In HHG, the trajectory of the electron that contributes to the HHG process is substantially determined by the electric field of the incoming laser light. In the so-called "three step model" describing HHG, electrons tunnel through the Coulomb barrier which is at that moment substantially suppressed by the laser field (step 1), follow a trajectory determined by the laser field (step 2) and recombine with a certain probability while releasing their kinetic energy plus the ionization energy in the form of radiation (step 3). An alternative definition of the difference between HHG and the generation of radiation of the lower harmonics is that all radiation with photon energy above the ionization energy of the target atoms is "High Harmonic" radiation, e.g. HHG generated radiation, and all radiation with photon energy below the ionization energy is non-HHG generated radiation. If Neon is used as a gas target, all radiation with a wavelength shorter than 62 nm (having a photon energy higher than 20.18 eV) is generated by means of the HHG process. For Argon as a gas target, all radiation having a photon energy higher than about 15.8 eV is generated by means of the HHG process.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of manufacturing a reflector, the method comprising:
shaping a part of an outer surface of an axially symmetric mandrel to form an inverse optical surface part that is not rotationally symmetric about an axis of the mandrel;
forming a reflector body around the mandrel; and
releasing the reflector body from the mandrel, whereby the reflector body has an optical surface part defined by the inverse optical surface part and a supporter surface part defined by the remaining outer surface of the mandrel.

2. The method of claim 1, wherein the shaping comprises super polishing using Magneto-Rheological Fluid Finishing (MRF), Fluid Jet Polishing (FJP), Elastic Emission Machining (EEM), Ion Beam Figuring, or Float Polishing.

3. The method of claim 2, wherein the super polishing is performed so that the inverse optical surface part has a surface roughness less than 100 pm Root Mean Square (RMS), less than 50 pm RMS, or less than 35 pm RMS.

4. The method of claim 1, further comprising applying a reflection enhancing single or multi-layer coating to the optical surface part of the reflector body.

5. The method of claim 1, further comprising applying an electrode and release layer to the mandrel after the shaping and before the forming.

6. The method of claim 5, wherein the electrode and release layer comprises gold (Au), chromium (Cr), platinum (Pt), or a combination thereof.

7. The method of claim 5, wherein the forming comprises electrodepositing a material to form the reflector body.

8. The method of claim 7, wherein the material comprises nickel (Ni), low-stress nickel (Ni), stress-free nickel (Ni), or a combination thereof.

9. The method of claim 1, wherein the forming comprises electrodepositing, electroplating, curing, vacuum evaporating, and/or vacuum adhering a material to form the reflector body.

10. The method of claim 9, wherein the material comprises nickel (Ni), low-stress nickel (Ni), stress-free nickel (Ni), a nickel sulfamate $(Ni(SO_3NH_2)_2)$ bath, a resin, a glass, a ceramic, a polymer, a thermoplastic, or a combination thereof.

11. The method of claim 1, further comprising repeating the forming and the shaping steps to form a plurality of reflector bodies using the same mandrel.

12. The method of claim 1, further comprising applying a reinforcement to an outer surface of the reflector body either before or after the releasing.

13. The method of claim 12, wherein the reinforcement comprises a rib, a holder, a projection, or a combination thereof.

14. The method of claim 1, wherein the releasing comprises heating or cooling the mandrel and/or the reflector body.

15. The method of claim 1, further comprising performing optical holography to form a holographic phase grating on the inverse optical surface part of the mandrel.

16. The method of claim 15, wherein forming comprises forming a diffraction grating on the optical surface part of the reflector body.

17. A method of manufacturing a plurality of reflectors, the method comprising:
- shaping a plurality of parts of an outer surface of an axially symmetric mandrel to form a plurality of inverse optical surface parts that are not rotationally symmetric about an axis of the mandrel;
- forming a reflector body around the mandrel; and
- releasing the reflector body from the mandrel, whereby the reflector body has a plurality of optical surface parts defined by the plurality of inverse optical surface parts and a supporter surface part defined by the remaining outer surface of the mandrel.

18. The method of claim 17, wherein the plurality of optical surface parts form a Wolter type optic, a Kirkpatrick-Baez type optic, an abutting optic, a circumferentially spaced optic, a circumferentially opposing optic, or a combination thereof.

19. The method of claim 17, further comprising separating the supporter surface part from the plurality of optical surface parts to provide a plurality of stand-alone reflectors.

20. The method of claim 17, further comprising repeating the forming and the shaping steps to form a plurality of reflector bodies using the same mandrel.

\* \* \* \* \*